United States Patent
Yu

(10) Patent No.: US 10,283,179 B2
(45) Date of Patent: May 7, 2019

(54) MAGNETIC TUNNEL JUNCTION MEMORY DEVICE

(71) Applicant: Taiwan Semiconductor Manufacturing Company, Ltd., Hsinchu (TW)

(72) Inventor: Chwen Yu, Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 15/879,975

(22) Filed: Jan. 25, 2018

(65) Prior Publication Data
US 2018/0151213 A1 May 31, 2018

Related U.S. Application Data

(60) Continuation of application No. 15/691,099, filed on Aug. 30, 2017, now Pat. No. 9,886,990, which is a
(Continued)

(51) Int. Cl.
*G11C 11/00* (2006.01)
*G11C 11/16* (2006.01)
(Continued)

(52) U.S. Cl.
CPC .......... *G11C 11/161* (2013.01); *G11C 11/155* (2013.01); *G11C 11/16* (2013.01);
(Continued)

(58) Field of Classification Search
CPC ..... G11C 11/00; G11C 11/161; G11C 11/155; G11C 11/16; G11C 11/1655; H01L 27/222; H01L 43/02; H01L 43/08
(Continued)

(56) References Cited

U.S. PATENT DOCUMENTS 7,006,375 B2  2/2006 Covington
2009/0323402 A1* 12/2009 Li et al. ................. 365/158
(Continued)

FOREIGN PATENT DOCUMENTS

KR  1020110106332  9/2011
KR  1020120024879  3/2012
(Continued)

OTHER PUBLICATIONS

Taiwan Patent Office, Taiwanese Office Action dated Mar. 25, 2015, Application No. 10420380780 filed Dec. 3, 2012, 5 pages. No translation.
(Continued)

*Primary Examiner* — Harry W Byrne
(74) *Attorney, Agent, or Firm* — Haynes and Boone, LLP

(57) ABSTRACT

Various memory devices and associated methods of operation are disclosed herein. An exemplary method includes flowing a current through an electrode of a memory device. The current exerts a spin-torque for orienting a magnetic field of a magnetic layer of the memory device and produces a magnetic field in the electrode that assists in orienting the magnetic field of the magnetic layer. The current can produce the magnetic field in the electrode when flowing through a region of the electrode having a winding orientation that is substantially perpendicular to a longitudinal axis of the memory device. In some implementations, flowing the current through the electrode includes storing data in the memory device.

20 Claims, 5 Drawing Sheets

Related U.S. Application Data division of application No. 14/968,591, filed on Dec. 14, 2015, now Pat. No. 9,779,793, which is a division of application No. 13/692,493, filed on Dec. 3, 2012, now Pat. No. 9,214,212.

(51) Int. Cl.
| | | |
|---|---|---|
| *H01L 43/08* | (2006.01) | |
| *H01L 27/22* | (2006.01) | |
| *G11C 11/155* | (2006.01) | |
| *H01L 43/02* | (2006.01) | |

(52) U.S. Cl.
CPC ...... *G11C 11/1655* (2013.01); *G11C 11/1675* (2013.01); *H01L 27/222* (2013.01); *H01L 43/02* (2013.01); *H01L 43/08* (2013.01)

(58) Field of Classification Search
USPC ....... 365/48, 55, 62, 66, 74, 78, 80–93, 100, 365/129, 130, 131, 148, 158, 171–173, 365/209, 213, 225.5, 230.07, 232, 243.5; 257/295, 421, 422, 427, E21.665, 257/E27.006; 438/3; 977/933–935
See application file for complete search history.

(56) References Cited

U.S. PATENT DOCUMENTS

| | | | |
|---|---|---|---|
| 2009/0323403 A1* | 12/2009 | Chen et al. | 365/158 |
| 2010/0103728 A1* | 4/2010 | Zhu et al. | 365/171 |
| 2010/0103729 A1* | 4/2010 | Zhu et al. | 365/171 |
| 2010/0226169 A1* | 9/2010 | Gao et al. | 365/171 |
| 2010/0277971 A1* | 11/2010 | Slaughter et al. | 365/158 |
| 2010/0302843 A1 | 12/2010 | Li et al. | |
| 2011/0051503 A1* | 3/2011 | Hu et al. | 365/158 |
| 2011/0205788 A1 | 8/2011 | Reed et al. | |
| 2011/0292714 A1* | 12/2011 | Andre et al. | 365/148 |
| 2012/0257449 A1 | 10/2012 | Agan et al. | |

FOREIGN PATENT DOCUMENTS

| | | |
|---|---|---|
| TW | 200842843 | 11/2008 |
| TW | 200842868 | 11/2008 |

OTHER PUBLICATIONS

Korean Intellectual Property Office, Korea Notice of Allowance dated Jan. 26, 2015, Application No. 10-2013-0039186, 3 pages.

* cited by examiner

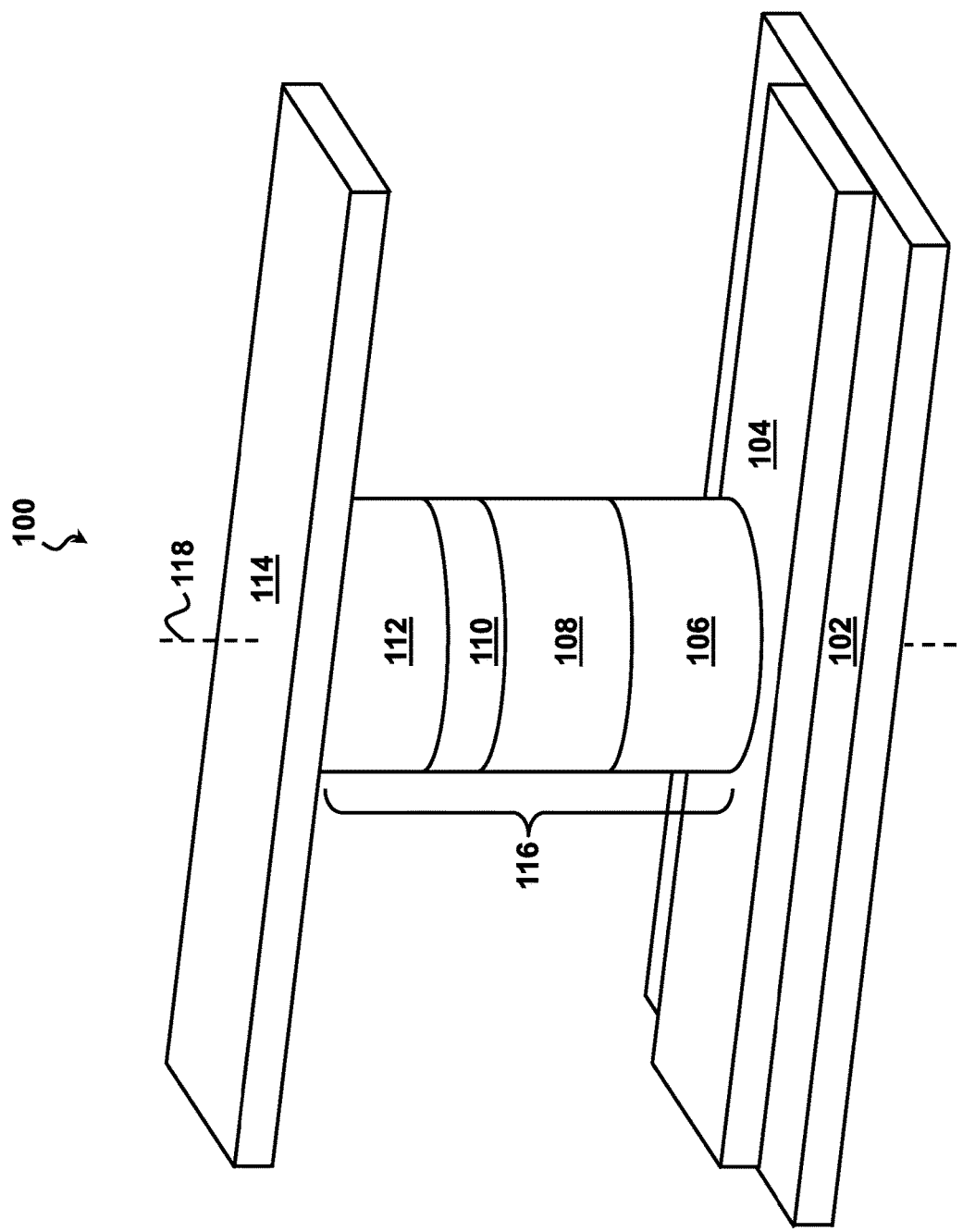

MAGNETIC TUNNEL JUNCTION MEMORY DEVICE

This is a continuation patent application of U.S. patent application Ser. No. 15/691,099, filed Aug. 30, 2017, now U.S. Pat. No. 9,886,990, which is a divisional patent application of U.S. patent application Ser. No. 14/968,591, filed Dec. 14, 2015, now U.S. Pat. No. 9,779,793, which is a divisional patent application of U.S. patent application Ser. No. 13/692,493, filed Dec. 3, 2012, now U.S. Pat. No. 9,214,212, all of which are herein incorporated by reference in their entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. While this process is not without limits, expectations exist of uninterrupted improvement in device scaling, performance, and efficiency. To meet these expectations, new technologies must be aggressively pursued.

Magnetic random access memory (MRAM) is an emerging technology for temporary storage and retrieval of data. Unlike other types of magnetic storage that directly measure magnetic field strength, MRAM data values are determined based on the resistance of a magnetic tunnel junction (MTJ) device within an MRAM cell. The MTJ structure typically comprises two magnetic layers separated by a thin insulator layer. Data is written by altering the magnetic field direction of one of the magnetic layers. This affects the resistance of the structure, thereby storing the written data. Although existing MRAM designs have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a simplified perspective view of a magnetic tunnel junction (MTJ) device according to various aspects of the present disclosure.

DETAILED DESCRIPTION

Figure 3:
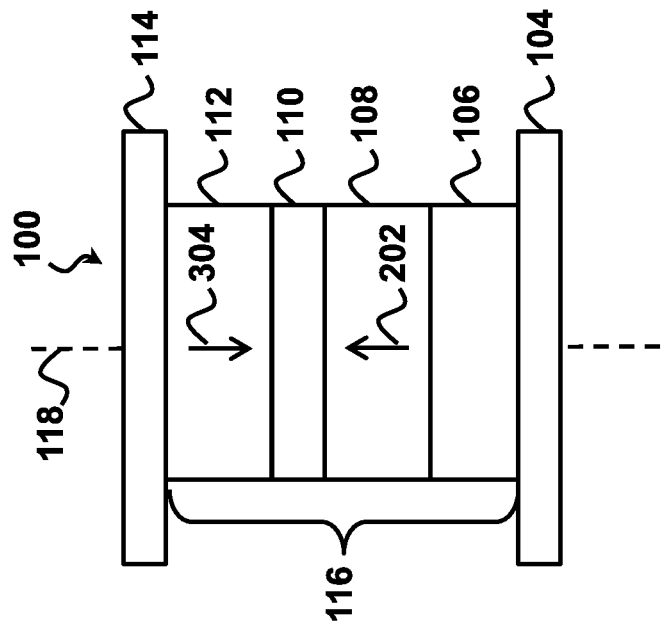
FIG. 3 is an annotated sectional view of a magnetic tunnel junction device in a second operating condition according to various aspects of the present disclosure.

The present disclosure relates generally to magnetic random access memory (MRAM) and more particularly, to a magnetic tunnel junction (MTJ) structure incorporating a magnetic assist feature that utilizes both spin-torque transfer and a magnetic field to perform a write.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

A magnetic tunnel junction device (MTJ) is described with reference to FIGS. 1-3. The structure of the magnetic tunnel junction device 100 is described with reference made to FIG. 1. Subsequently, the function of the MTJ device 100 is described in further detail with reference made to FIGS. 2 and 3. FIG. 1 is a perspective view of the magnetic tunnel junction (MTJ) device 100 according to various aspects of the present disclosure. FIG. 1 has been simplified for clarity. For example, the magnetic tunnel junction device 100 may include one or more dielectric layers insulting the components of the device 100 and providing structural support for the device 100 and associated components. As another example, the magnetic tunnel junction device 100 may include one or more passivation layers and/or moisture blocking layers. These have been omitted from FIG. 1 to reveal other elements of the device 100 more clearly.

The magnetic tunnel junction device 100 may be formed on a substrate 102, for example, a bulk silicon substrate. Alternatively, the substrate 102 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

Some exemplary substrates 102 include an insulator layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary substrates 102, the insulator layer is a component (e.g., layer) of a silicon-on-insulator substrate.

The substrate 102 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 102, in a P-well structure, in an N-well structure, in a dual-well structure, or using a raised structure. The semiconductor substrate 102 may further include various active regions, such as regions configured for an N-type metal-oxide-semiconductor transistor device and regions configured for a P-type metal-oxide-semiconductor transistor device.

The magnetic tunnel junction device 100 may include a first electrode (or bottom electrode) 104 formed on the substrate 102. The bottom electrode 104 includes a conductive material such as tantalum, platinum, ruthenium, copper, aluminum, titanium, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. In an exemplary embodiment, the electrode 104 is formed using a physical vapor deposition (PVD) process such as sputtering.

In some embodiments, a pinning layer 106 is formed on the bottom electrode 104, and may be electrically coupled to the bottom electrode 104. The pinning layer 106 may include an anti-ferromagnetic material. In anti-ferromagnetic materials, internal magnetic moments tend to align in alternating patterns. In this configuration, adjacent moments tend to cancel, and thus such materials tend to exhibit a minimal net magnetic field internally. Despite the minimal net field, anti-ferromagnetic materials may alter the behavior of magnetic fields of other materials in what is referred to as an exchange coupling effect. For example, an anti-ferromagnetic material may resist changes in the magnetic field of another exchange-coupled material. Anti-ferromagnetic materials include platinum manganese (PtMn), iridium manganese ("IrMn"), rhodium manganese ("RhMn"), and iron manganese ("FeMn"). The pinning layer 106 may be formed by a suitable deposition technique, such as a PVD process. In a range of exemplary embodiments, an anti-ferromagnetic pinning layer 106 is formed to a thickness ranging between approximately 100 angstroms and approximately 200 angstroms and is formed by a suitable process such as PVD.

A first magnetic layer, referred to as a pinned layer 108, is formed on the electrode 104. In embodiments incorporating a pinning layer 106, the pinned layer is formed on top of the pinning layer 106. The pinned layer 108 may include a ferromagnetic material, for example a cobalt-iron film (CoFe) and/or a cobalt-iron-boron (CoFeB) film. The pinned layer 108 may also include other ferromagnetic materials, such as CoFeTa, NiFe, CoFe, CoPt, CoPd, FePt, and/or alloys of Ni, Co and Fe. In some embodiments, the pinned layer 108 has a thickness between approximately 40 and approximately 60 angstroms.

In some embodiments, the pinned layer 108 includes a multilayer structure, for example, one or more layers containing a ferromagnetic material interspersed with one or more spacer layers containing an anti-ferromagnetic material such as a synthetic anti-ferromagnetic (SAF) material. In one such embodiment, the pinned layer 108 includes two ferromagnetic films interposed by an anti-ferromagnetic spacer layer. In a further example of a multilayer structure, the pinned layer 108 includes one or more layers containing a ferromagnetic material interspersed with one or more spacer layers containing a conductive material. In one such embodiment, a spacer layer includes Ru. Spacer layers may include other suitable conductive materials, such as Ti, Ta, Cu, and/or Ag. In layered embodiments, the layers of the pinned layer 108 including the ferromagnetic-material containing layers and the spacer layers may be on the order of approximately 5 to approximately 10 angstroms in thickness. The ferromagnetic materials, the anti-ferromagnetic materials, and/or the conductive materials that make up the pinned layer 108 may be applied and formed using a PVD or other suitable process.

A barrier layer 110 may be formed on the pinned layer 108. The barrier layer 110 may include a non-magnetic material, such as magnesium (Mg). In various illustrative embodiments, the barrier layer 110 includes magnesium oxide (MgO), $Al_2O_3$, aluminum nitride (AlN), aluminum oxynitride (AlON), and/or other suitable non-magnetic material. Exemplary barrier layers 110 have a thickness ranging between approximately 5 and approximately 15 angstroms. The materials of the barrier layer 110 may be applied by a process including a PVD and/or other suitable deposition process. In one embodiment, a magnesium target and an oxygen gas are provided in a sputtering chamber to form magnesium oxide. In another embodiment, a magnesium film is formed by sputtering. The Mg film is then converted into an MgO film by applying an oxygen gas.

In some embodiments, the barrier layer 110 has a multilayer structure. For example, in one such embodiment, the barrier layer 110 includes a first film of MgO and a second film of Mg over the first film. Such a structure may be formed by Mg deposition followed by Mg oxidation and subsequent Mg deposition. For example, a first magnesium film is formed by sputtering. The first film is then converted into an MgO film by applying an oxygen plasma. Subsequently, a second Mg layer is deposited on the MgO layer by sputtering. This forms the exemplary MgO/Mg layered barrier 110.

A second magnetic layer, the free layer 112, may be formed on the barrier layer 110. As with the pinned layer 108, the free layer 112 may include a ferromagnetic material such as a cobalt-iron compound (CoFe) and/or a cobalt-iron-boron (CoFeB) compound. In one set of examples, suitable CoFeB compounds have compositions expressed as $(Co_xFe_{1-x})_{80}B_{20}$, where the subscripts represent alloy mole fractions and where x ranges between 0 and 100, inclusive. The free layer 112 may also include other ferromagnetic materials, such as CoFeTa, NiFe, CoFe, CoPt, CoPd, FePt, and/or alloys of Ni, Co and Fe. A typical free layer 112 may be between approximately 10 and approximately 20 angstroms thick, and deposited using a PVD or other suitable process.

A second electrode (or top electrode) 114 may be formed on the free layer 112 such that the top electrode 114 is electrically coupled to the free layer 112. The top electrode 114 may be similar to the bottom electrode 104 in terms of composition and deposition. For example, the electrode 114 may include a conductive material such as tantalum, platinum, ruthenium, copper, aluminum, titanium, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. In an exemplary embodiment, the electrode 114 is formed using a physical vapor deposition (PVD) process such as sputtering.

In the illustrated embodiment, the pinning layer 106, the pinned layer 108, the barrier layer 110, and the free layer 112 are approximately cylindrical, resulting in a device 100 with an approximately cylindrical device body 116. In further embodiments, one or more of the layers have an alternate form, for example, a cuboid or an n-sided prism, resulting in a device body 116 with an alternate form. Such embodiments fall within the scope of the present disclosure. For ease of reference, a longitudinal axis 118 of the device body is defined extending through the pinned layer 108, the barrier layer 110, and the free layer 112.

The function of the magnetic tunnel junction device 100 will now be described with reference made to FIGS. 2 and 3. FIG. 2 is an annotated sectional view of a magnetic tunnel junction device 100 in a first operating condition according to various aspects of the present disclosure. FIG. 3 is an annotated sectional view of a magnetic tunnel junction device in a second operating condition according to various aspects of the present disclosure. Various elements of the magnetic tunnel junction device 100 have been omitted from FIGS. 2 and 3 in order to illustrate other elements more clearly. In many regards, the magnetic tunnel junction devices of FIGS. 2 and 3 are substantially similar to the device 100 of FIG. 1. In that regard the devices of FIGS. 2 and 3 may include a bottom electrode 104, a pinning layer 106, a pinned layer 108, a barrier layer 110, a free layer 112, and a top electrode 114.

Figure 2:
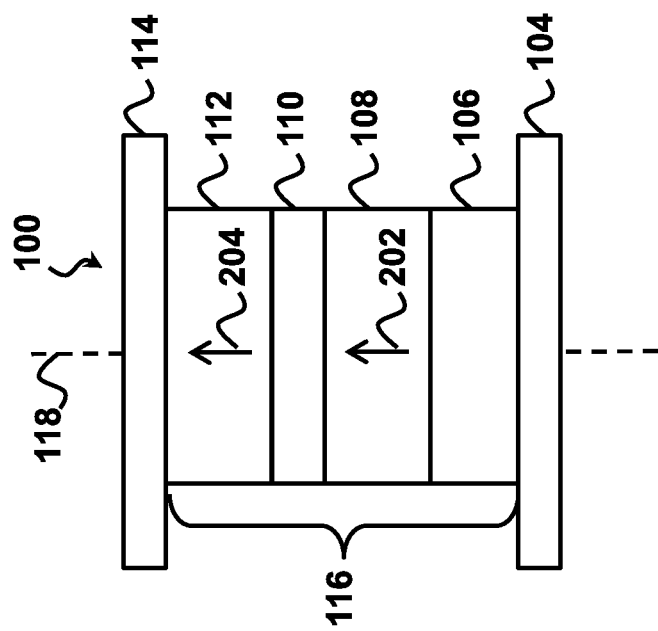
FIG. 2 is an annotated sectional view of a magnetic tunnel junction device in a first operating condition according to various aspects of the present disclosure.

Referring to FIG. 2, the pinned layer 108 exhibits a magnetic field in a first orientation represented by arrow 202. Thus, the first orientation is substantially perpendicular to the interface of the pinned layer 108 and the barrier layer 110 and is substantially parallel to the longitudinal axis 118 of the device body 116. However, other alignments are contemplated and provided for. For example, in some embodiments, the first orientation is substantially parallel to the interface of the pinned layer 108 and the barrier layer 110. In some embodiments, the first orientation is substantially perpendicular to the longitudinal axis 118 of the device body 116. These alternative alignments are equally suitable.

In many embodiments, the materials and structure of the pinned layer 108 are configured to produce and retain the magnetic field. The field may be further maintained in part by the pinning layer 106. For example, in anti-ferromagnetic materials commonly used to construct the pinning layer 106, the magnetic moments of the atoms or molecules align in a pattern such that adjacent moments are opposite. As a result, the pinning layer 106 exhibits a minimal net magnetic field internally yet has an exchange coupling effect externally. The exchange coupling raises the energy required to reorient a magnetic field of a coupled material, and thus, the anti-ferromagnetic material can be used to "pin" or prevent the switching of the magnetic alignment of the pinned layer 108. It is understood that anti-ferromagnetism is only one example of a method of pinning the pinned layer 108. Other embodiments incorporate other pinning methods and structures in addition to or as a replacement for an anti-ferromagnetic pinning layer 106.

In the first operating condition, the free layer 112 also exhibits a magnetic field. The magnetic field orientation, indicated by arrow 204, is substantially parallel to and in substantially the same direction as the magnetic field orientation of the pinned layer 108. In this condition, the alignments of the fields of the free layer 112 and the pinned layer 108 promotes the tunneling of electrons through the barrier layer. Accordingly, in the first operating condition, the magnetic tunnel junction device 100 exhibits a relatively low resistance along the body 116 as measured between the top electrode 114 and the bottom electrode 104.

Referring to FIG. 3, the magnetic tunnel junction device 100 in the second operating condition is substantially similar to the device 100 in the first operating condition. For example, in the embodiment of FIG. 3, the magnetic field of the pinned layer has a first orientation (e.g., the orientation represented by arrow 202, substantially parallel to the longitudinal axis 118 of the device body 116). However, the magnetic field of the free layer 112, indicated by arrow 304, is substantially parallel to but substantially opposite the field orientation of the pinned layer 108. As a result, the magnetic tunnel junction device 100 exhibits a relatively higher resistance along the body 116 as measured between the top electrode 114 and the bottom electrode 104. In an exemplary embodiment, the high resistance is twice the low resistance of a given device 100. The difference between the low resistance of FIG. 2 and the high resistance of FIG. 3 may be expressed as a magnetoresistance ratio. Higher ratios may result in improved read accuracy, access speed, and device reliability.

The first and second operating conditions may correlate with first and second stored data values. For example, the first operating condition and low resistance state may correspond to a stored "0" binary value, and the second operating condition and high resistance state may correspond to a stored "1" binary value. In order to read the stored value, an electric potential may be applied between the top electrode 114 and the bottom electrode 104, and the device 100 resistance may be measured.

Writing stored data involves changing the magnetic field of the free layer 112 such that the device 100 transitions between a low-resistance operating state and a high-resistance operating state and vice-versa. In some embodiments, a magnetic field is applied to the free layer 112. A magnetic field of sufficient strength can cause the magnetic moments within the free layer 112 to align in either a low-resistance operating state orientation (e.g., an orientation substantially parallel to and in substantially the same direction as the magnetic orientation of the pinned layer 108), or a high-resistance operating state orientation (e.g., an orientation substantially parallel to but substantially opposite to the magnetic orientation of the pinned layer 108). A typical magnetic field used to write to a device 100 may be between approximately 100 and approximately 150 Gauss. As will be recognized by one of skill in the art, the magnetic field shape and strength may be selected to be sufficient to cause the intended alignment of the free layer 112 without affecting either the pinned layers 108 or the free layers 112 of adjacent devices 100. Protecting the adjacent devices 100 may involve shielding between devices 100, reduced write field strength, and/or increased spacing between devices 100.

In some embodiments, an electrical current is used to alter the orientation of the magnetic field of the free layer 112. One technique for doing so is referred to as spin-torque transfer. Current flow through a first ferromagnetic layer, for example, the pinned layer 108, may align the flowing electrons creating a spin-polarized current. The spin-polarized current can, in turn, transfer the angular momentum of the flowing electrons to a second ferromagnetic layer, for example, the free layer 112. The direction of the current determines whether the induced magnetic alignment within the second ferromagnetic layer is substantially parallel to and in substantially the same direction as the magnetic orientation of the first layer or substantially parallel to and substantially opposite the magnetic orientation of the first layer. One advantage to spin-torque transfer devices 100 is that the write current often lacks sufficient electromagnetic flux to affect neighboring devices. This may allow spin-torque transfer devices to be spaced closer than magnetic-field-write devices.

Figure 4:
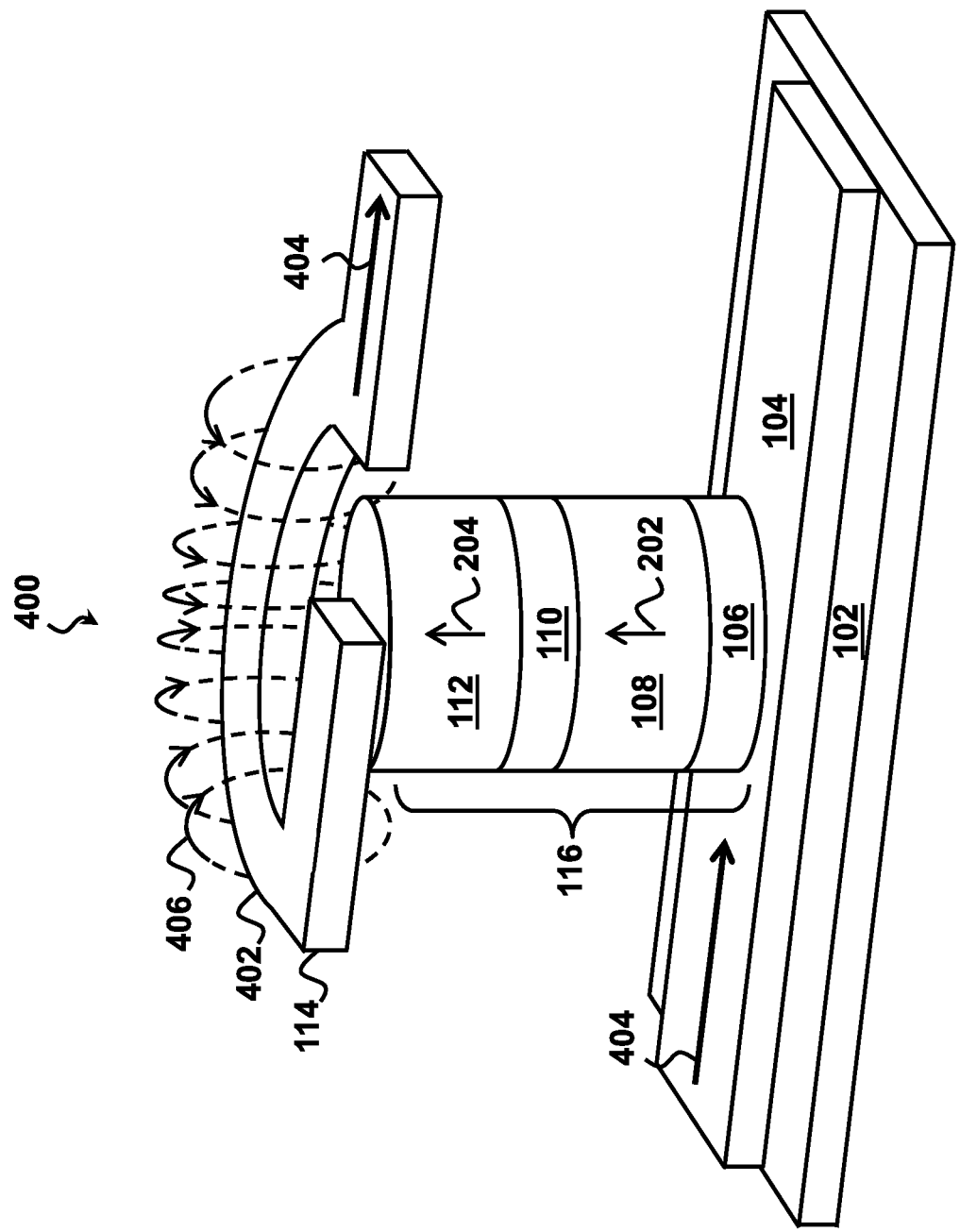
FIG. 4 is a perspective view of a spin-torque transfer magnetic tunnel junction device incorporating a partially circular magnetic assist region according to various aspects of the present disclosure.

FIG. 4 is a perspective view of a spin-torque transfer magnetic tunnel junction device 400 incorporating a partially circular magnetic assist region 402 according to various aspects of the present disclosure. FIG. 4 has been simplified for clarity. For example, the magnetic tunnel junction device 400 may include one or more dielectric layers insulting the components of the device 400 and providing structural support for the device 400 and associated components. As another example, the magnetic tunnel junction device 400 may include one or more passivation layers and/or moisture blocking layers. These have been omitted from FIG. 4 to reveal other elements of the device 400 more clearly. In many regards, the device 400 of FIG. 4 is substantially similar to the magnetic tunnel junction device 100 of FIG. 1. For example, device 400 may include a substrate 102, a top electrode 114, a bottom electrode, a pinning layer 106, a pinned layer 108, a barrier layer 110, and/or a free layer 112 substantially similar to those of device 100.

In some embodiments, the top electrode 114 includes a magnetic assist region 402 disposed above the free layer 112. In the illustrated embodiment, the magnetic assist region 402 includes a partially circular coil region having a winding orientation substantially perpendicular to the longitudinal axis of the device body 118 (axis omitted for clarity). The magnetic assist region 402 is configured such that current flow through the region 402 produces a magnetic field that assists the spin-torque transfer of the current in aligning the magnetic orientation of the free layer 112. In more detail, the write current flowing in a first direction indicated by arrows 404 exerts a spin-torque tending towards establishing a magnetic field in the free layer 112 in the direction indicated by arrow 204 (e.g., an orientation substantially parallel to and in substantially the same direction as the magnetic orientation of the pinned layer 108). The same write current flowing through the magnetic assist region 402 also produces a net magnetic field as indicated by arrows 406. This net magnetic field also contributes to induce, via a magnetic-field write, a magnetic field in the free layer 112 in the direction indicated by arrow 204 (e.g., an orientation substantially parallel to and in substantially the same direction as the magnetic orientation of the pinned layer 108). The net magnetic field induced by a semicircular wire can be calculated by the equation:

$$H = \frac{1}{2}[\mu_O \ast I/2R]$$

where H is the magnetic field strength, $\mu_O$ is a constant equal to $4\pi \ast 10^{-3}$ Gauss*m/A, I is the current, and R is the radius of the circle. Thus, in an exemplary embodiment where I is 0.2 mA and the loop has a radius of 30 nm, the resulting magnetic field is approximately 20 Gauss. Due to the shape of the magnetic assist region 402, the net magnetic field assists the change in magnetic orientation of the free layer 112. Utilizing both the spin-torque transfer and the net magnetic field produced by the write current may reduce the switching current of the device 400 compared to that of a purely spin-torque transfer or purely magnetic-field-write device. In an embodiment, a device 400 has a threshold STT (spin-torque transfer) current defined as a minimum write current to reliably induce the intended field orientation in the free layer 112 by spin-torque transfer alone. However, due in part to the magnetic field assist produced by the flow of the write current through the magnetic assist region 402, the switching current used to reliably induce the intended field orientation in the free layer 112 is lower than the threshold STT current. For example, the switching current may be approximately 20% lower than the threshold STT current, and in some embodiments, the switching current is lower still.

The result is that in many embodiments, magnetic tunnel junction devices that incorporate an electrode with a magnetic assist region 402 such as that of device 400 are more energy efficient and produce less heat. This conveys numerous benefits. For example, reduced energy and thermal requirements may allow the MTJ devices 400 to be spaced closer and may also allow reductions in size and drive strength of supporting circuitry including the write current generator. In some embodiments, because the magnetic field produced by the write current need not be as strong as the field of a magnetic-field-write device, there is a reduced risk of affecting an adjacent device. Additionally, the net magnetic field produced by a magnetic assist region 402 is focused at the center of the circle and diffuse outside the circumference. This further reduces the strength of the magnetic field experienced by adjacent devices and further reduces the opportunity for an unintended write. Accordingly, in some embodiments, this alleviates related spacing concerns and allows smaller inter-device spacing.

In the illustrated embodiment, the write current indicated by arrows 404 induces a magnetic orientation in the free layer 112 in the direction indicated by arrow 204, that is, in an orientation substantially parallel to and in substantially the same direction as the magnetic orientation of the pinned layer 108. This may be defined as a first operating condition. Likewise, a write current in the opposite direction may induce a magnetic orientation in the free layer 112 in the opposite direction, that is, in an orientation substantially parallel to but in the substantially opposite direction of the magnetic orientation of the pinned layer 108. This may be defined as a second operating condition. The first and second operating conditions may correlate to first and second stored data values. For example, the first operating condition and the associated low resistance state may correspond to a stored "0" binary value, and the second operating condition and the high resistance state may correspond to a stored "1" binary value. In this way, the write current may store a value in the magnetic tunnel junction device 400 via both spin-torque transfer and magnetic-field-write concurrently. In order to read the stored value, an electric potential may be applied between the top electrode 114 and the bottom electrode 104, and the device 100 resistance may be measured.

The magnetic field orientations indicated by arrows 202 and 204 are merely exemplary. One of skill in the art will recognize that in some embodiments, the fields of the pinned layer 108 and free layer 112 of the device 400 may be oriented differently, for example, substantially parallel to the interface of the pinned layer 108 and the barrier layer 110. Other alignments both are contemplated and provided for. These alignments are equally suitable.

One of skill in the art will also recognize that the present disclosure encompasses alternate configurations of the magnetic assist region 402. For example, in the embodiment of FIG. 4, the magnetic assist region 402 represents approximately 180° of a circle. In various other embodiments, the magnetic assist region 402 represents approximately 90°, 270°, and 360° of a circle.

Figure 5:
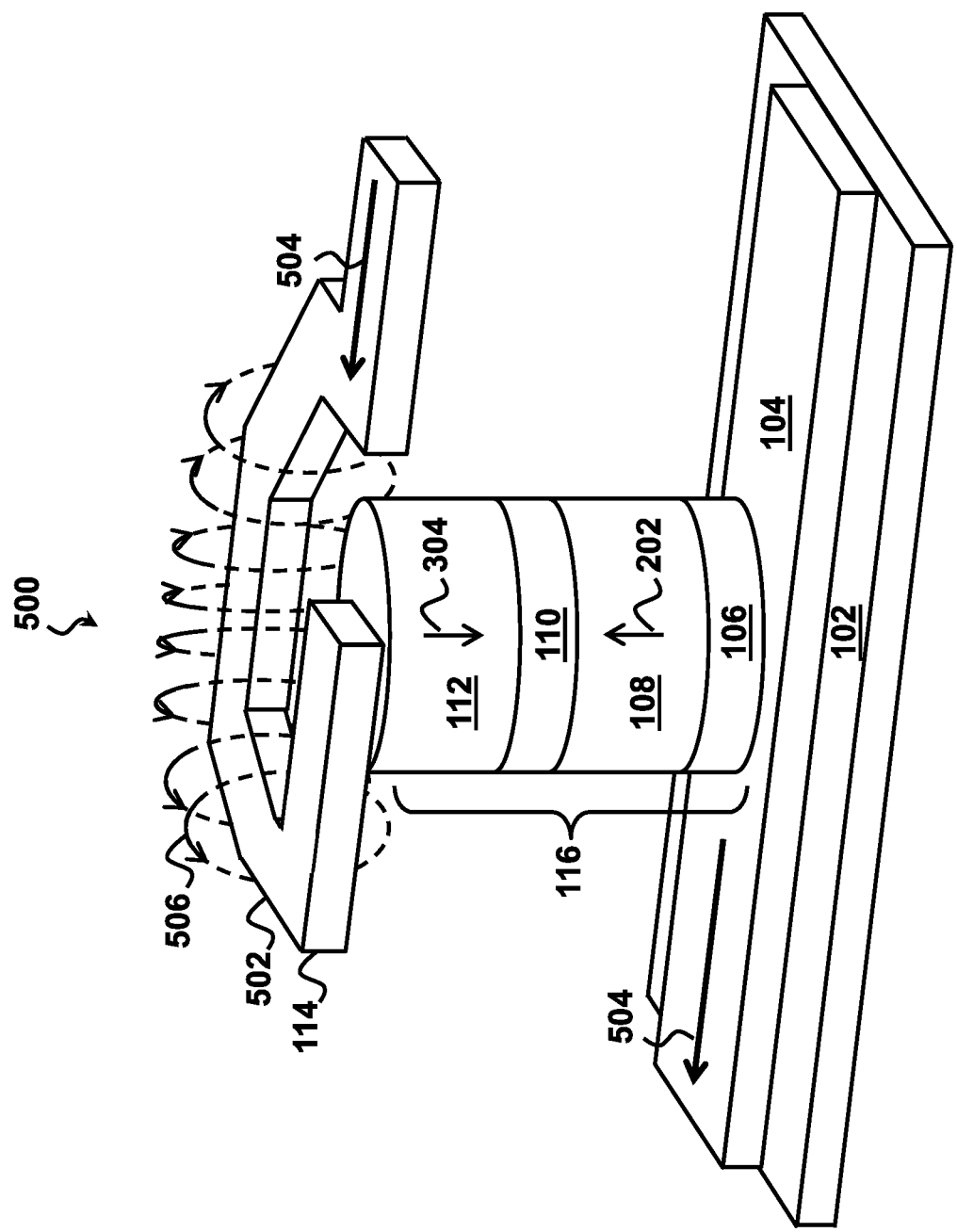
FIG. 5 is a perspective view of a spin-torque transfer magnetic tunnel junction device 500 incorporating a piecewise linear, partially circular, magnetic assist region according to various aspects of the present disclosure.

FIG. 5 is a perspective view of a spin-torque transfer magnetic tunnel junction (MTJ) device 500 incorporating a piecewise linear, partially circular, magnetic assist region 502 according to various aspects of the present disclosure. FIG. 5 has been simplified for clarity. For example, the magnetic tunnel junction device 500 may include one or more dielectric layers insulting the components of the device 500 and providing structural support for the device 500 and associated components. As another example, the magnetic tunnel junction device 500 may include one or more passivation layers and/or moisture blocking layers. These have been omitted from FIG. 5 to reveal other elements of the device 500 more clearly. In many regards, the device 500 of FIG. 5 is substantially similar to the magnetic tunnel junction device 100 of FIG. 1 and the magnetic tunnel junction device 400 of FIG. 4. For example, device 500 may include a substrate 102, a top electrode 114, a bottom electrode, a pinning layer 106, a pinned layer 108, a barrier layer 110, and/or a free layer 112 substantially similar to those of device 100.

In some embodiments, the top electrode 114 includes a magnetic assist region 502 disposed above the free layer 112. The magnetic assist region 502 is configured such that current flow through the region 502 produces a magnetic field that assists the spin-torque transfer of the current in aligning the magnetic orientation of the free layer 112. For example, the write current flowing in a first direction indicated by arrows 504 induces, via spin-torque transfer, a net magnetic field in the free layer 112 in the direction indicated by arrow 304 (e.g., an orientation substantially parallel to but in an substantially opposite direction of the magnetic orientation of the pinned layer 108). The same write current flowing through the magnetic assist region 502 also produces a magnetic field as indicated by arrows 506. This magnetic field also contributes to induce, via a magnetic-field-write, a magnetic field in the free layer 112 in the direction indicated by arrow 304 (e.g., an orientation substantially parallel to and substantially opposite the magnetic orientation of the pinned layer 108).

In contrast to the region 402 of FIG. 4, the magnetic assist region 502 has a partially circular coil shape comprising piecewise linear segments. In some design environments, linear segments are easier to manufacture reliably than a circular or semi-circular shape. Accordingly, in some embodiments, the magnetic assist region 502 is formed from linear segments that make up the coil region having a winding orientation substantially perpendicular to the top surface of the free layer 112. In the illustrated embodiment, the design environment supports diagonal conductors, and thus, linear segments may join at an angle of substantially 45°. Further embodiments support additional conductor orientations and additional segment angles including substantially 30° and substantially 60°.

Similar to the embodiment of FIG. 4, the magnetic assist produced by the flow of the write current through the magnetic assist region 502 may reduce the current threshold to alter the magnetic orientation of the free layer 112 over that of a purely spin-torque transfer or magnetic-field-write device. As a result, in many embodiments, the magnetic tunnel junction device 500 is more energy efficient and produces less heat than designs utilizing spin-torque transfer or magnetic-field-write alone.

Figure 6:
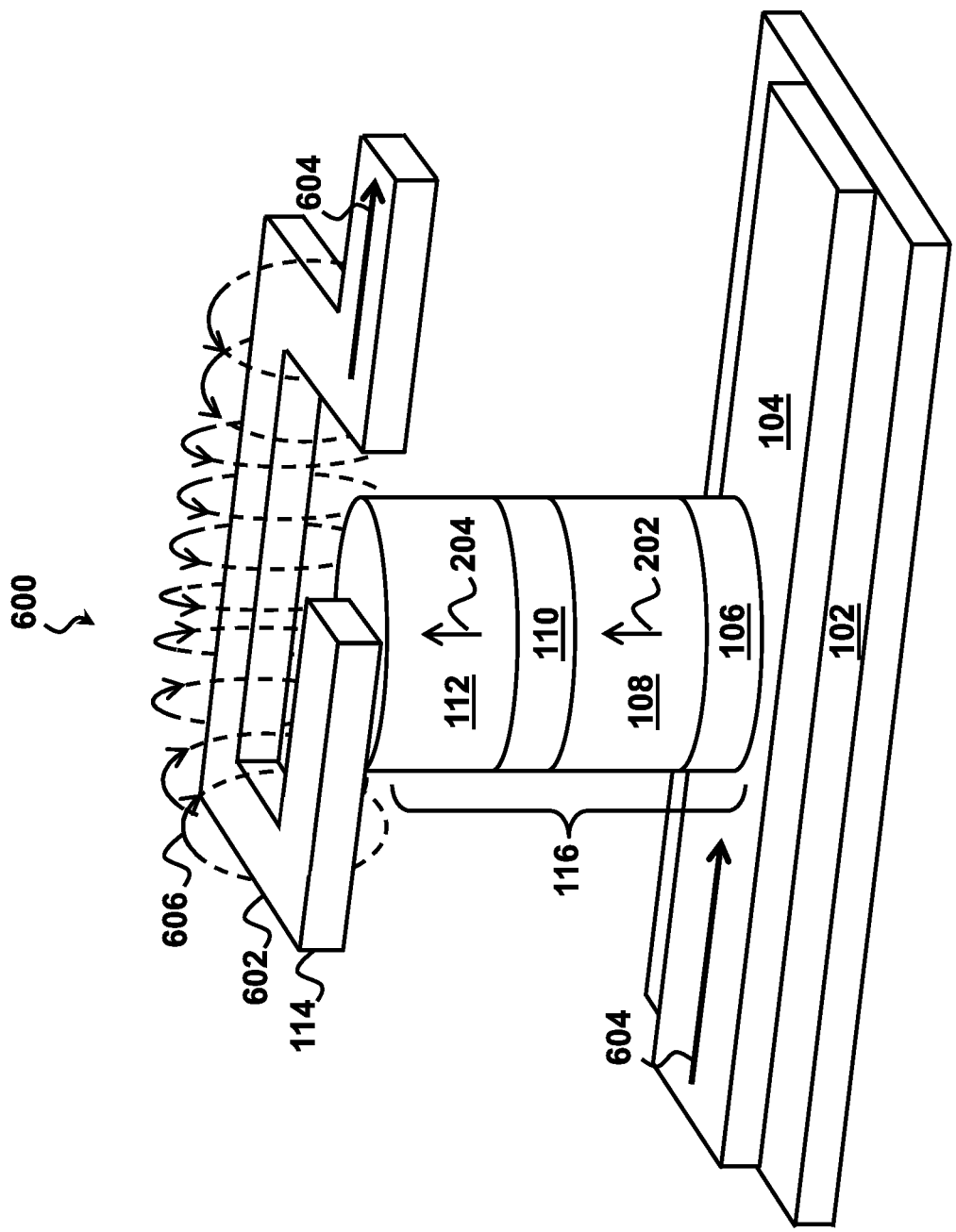
FIG. 6 is a perspective view of a spin-torque transfer magnetic tunnel junction device incorporating a partially rectangular magnetic assist region according to various aspects of the present disclosure.

FIG. 6 is a perspective view of a spin-torque transfer magnetic tunnel junction device 600 incorporating a partially rectangular magnetic assist region 602 according to various aspects of the present disclosure. FIG. 6 has been simplified for clarity. For example, the magnetic tunnel junction device 600 may include one or more dielectric layers insulting the components of the device 600 and providing structural support for the device 600 and associated components. As another example, the magnetic tunnel junction device 600 may include one or more passivation layers and/or moisture blocking layers. These have been omitted from FIG. 5 to reveal other elements of the device 600 more clearly. In many regards, the device 600 of FIG. 5 is substantially similar to the magnetic tunnel junction device 100 of FIG. 1, the magnetic tunnel junction device 400 of FIG. 4, and the magnetic tunnel junction device 500 of FIG. 5. For example, device 600 may include a substrate 102, a top electrode 114, a bottom electrode, a pinning layer 106, a pinned layer 108, a barrier layer 110, and/or a free layer 112 substantially similar to those of device 100.

In some embodiments, the top electrode 114 includes a magnetic assist region 602 disposed above the free layer 112. The magnetic assist region 602 is configured such that current flow through the region 602 produces a magnetic field that assists the spin-torque transfer of the current in aligning the magnetic orientation of the free layer 112. For example, the write current flowing in a first direction indicated by arrows 604 induces, via spin-torque transfer, a magnetic field in the free layer 112 in the direction indicated by arrow 204 (e.g., an orientation substantially parallel to and in substantially the same direction as the magnetic orientation 202 of the pinned layer 108). The same write current flowing through the magnetic assist region 602 also produces a magnetic field as indicated by arrows 606. This magnetic field also contributes to induce, via a magnetic-field-write, a magnetic field in the free layer 112 in the direction indicated by arrow 204 (e.g., an orientation substantially parallel to and in substantially the same direction as the magnetic orientation of the pinned layer 108).

In contrast to the region 402 of FIG. 4, magnetic assist region 602 has a partially rectangular coil shape having a winding orientation substantially perpendicular to the top surface of the free layer 112. This shape is particularly well suited to design environments that only support linear conductor segments and that only support two orientations of conductor, although it is suitable to other design environments as well. Similar to the embodiment of FIG. 4, the magnetic assist produced by the flow of the write current through the magnetic assist region 602 may reduce the current threshold to alter the magnetic orientation of the free layer 112 over that of a purely spin-torque transfer or magnetic-field-write device. As a result, in many embodiments, the magnetic tunnel junction device 600 is more energy efficient and produces less heat than designs utilizing spin-torque transfer or magnetic-field-write alone.

Thus, the present invention provides a structure and method for a magnetic assist spin-torque-transfer magnetic tunnel junction device. In some exemplary embodiments, a magnetic tunnel junction device is disclosed. The device comprises: a first electrode; a pinned layer disposed on the first electrode; a free layer disposed on the pinned layer; a barrier layer disposed between the pinned layer and the free layer; and a second electrode electrically coupled to the free layer, wherein the second electrode includes a magnetic assist region. In one such embodiment, the magnetic assist region is configured to produce a net magnetic field when supplied with a write current, and the net magnetic field is aligned to assist a spin-torque transfer of the write current on the free layer. In another such embodiment, the net magnetic field is aligned to orient an internal magnetic field of the free layer in a first orientation, and a spin-torque transfer of the write current on the free layer is aligned to orient the internal magnetic field of the free layer in the first orientation. In another such embodiment, the device further comprises a longitudinal device body that includes the pinned layer, the free layer, and the barrier layer, and the first orientation is substantially parallel to the longitudinal device body. In another such embodiment, the magnetic assist region includes a coil region having a winding orientation substantially perpendicular to a top surface of the free layer. In a further such embodiment, the coil region includes a partially circular region. In another such embodiment, the device further comprises a longitudinal device body that includes the pinned layer, the free layer, and the barrier layer, and the magnetic assist region is substantially perpendicular to the longitudinal device body. In another such embodiment, the partially circular region is piecewise linear. In a further such embodiment, the coil region includes a partially rectangular region.

In some exemplary embodiments, a magnetic tunnel junction device is disclosed, the device comprising: a bottom electrode; a pinned layer disposed on the bottom electrode; a barrier layer disposed on the pinned layer; a free layer disposed on the barrier layer; and a top electrode disposed on and electrically coupled to the free layer, wherein the top electrode is configured to produce a net magnetic field when supplied with a write current, wherein the net magnetic field is aligned to induce a magnetic orientation within the free layer, and wherein a spin-torque of the write current is aligned to induce the magnetic orientation within the free layer. In one such embodiment, the net magnetic field is configured such that a switching current of the device is less than a threshold write current for a spin-torque transfer write of the device. In another such embodiment, the device further comprises a longitudinal device body that includes the pinned layer, the barrier layer, and the free layer, and the magnetic orientation is substantially parallel to the longitudinal device body. In a further such embodiment, the top electrode includes a coil region having a winding orientation substantially perpendicular to a top surface of the free layer. In another such embodiment, the device further comprises a longitudinal device body that includes the pinned layer, the barrier layer, and the free layer, and wherein the coil region is substantially perpendicular to the longitudinal device body. In one such embodiment, the coil region includes a piecewise linear partially circular region. In another such embodiment, the top electrode includes a partially rectangular region. In a further such embodiment, the magnetic orientation is parallel to an internal magnetic field orientation of the pinned layer.

In some exemplary embodiments, a method of writing to a magnetic tunnel junction device is disclosed. The method includes providing a write current to a free layer of the magnetic tunnel junction device via an electrode electrically coupled to the device, wherein a flow of the write current through the electrode produces a net electromagnetic field aligned to induce a magnetic orientation in the free layer, and wherein the write current further induces the magnetic orientation in the free layer via spin-torque transfer. In one such embodiment, the magnetic orientation is substantially parallel to a device body of the magnetic tunnel junction device. In another such embodiment, the magnetic orientation is substantially parallel to and in substantially the same direction as a magnetic orientation of a pinned layer of the magnetic tunnel junction device. In a further such embodiment, the first magnetic orientation is substantially parallel to and in a substantially opposite direction of a magnetic orientation of a pinned layer of the magnetic tunnel junction device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   flowing a current through an electrode of a memory device, wherein the current:
   exerts a spin-torque for orienting a magnetic field of a magnetic layer of the memory device, and
   produces a magnetic field in the electrode that assists in orienting the magnetic field of the magnetic layer.

2. The method of claim 1, wherein the orienting the magnetic field includes inducing a magnetic orientation that is substantially parallel to a longitudinal axis of the memory device.

3. The method of claim 1, wherein:
   the memory device is a magnetic tunnel junction device and the magnetic layer is a free layer of the magnetic tunnel junction device; and
   the orienting the magnetic field includes inducing a magnetic orientation that is substantially parallel to and in substantially the same direction as a magnetic orientation of a magnetic field of a pinned layer of the magnetic tunnel junction device.

4. The method of claim 1, wherein:
   the memory device is a magnetic tunnel junction device and the magnetic layer is a free layer of the magnetic tunnel junction device; and
   the orienting the magnetic field includes inducing a magnetic orientation that is substantially parallel to and in substantially the opposite direction as a magnetic orientation of a magnetic field of a pinned layer of the magnetic tunnel junction device.

5. The method of claim 1, wherein the current produces the magnetic field in the electrode when flowing through a region of the electrode having a winding orientation that is substantially perpendicular to a longitudinal axis of the memory device.

6. The method of claim 5, wherein the region has a partially circular shape.

7. The method of claim 5, wherein the region has a partially rectangular shape.

8. The method of claim 5, wherein the region has a partially circular shape having piecewise linear segments.

9. A method comprising:
   providing a memory device having:
   a first electrode,
   a first magnetic layer disposed over the first electrode,
   a second magnetic layer disposed over the first magnetic layer, a barrier layer disposed between the first magnetic layer and the second magnetic layer, and a second electrode disposed over the second magnetic layer; and flowing a current through the second electrode, wherein the current:

exerts a spin-torque for orienting a magnetic field of the second magnetic layer of the memory device, and produces a magnetic field in the second electrode that assists in orienting the magnetic field of the second magnetic layer.

10. The method of claim 9, wherein the flowing the current through the second electrode includes:

generating a first current to flow through the second electrode in a first direction to establish a first magnetic orientation of the magnetic field in the second magnetic layer; and generating a second current to flow through the second electrode in a second direction to establish a second magnetic orientation of the magnetic field in the second magnetic layer, wherein the second direction is opposite the first direction and the second magnetic orientation is opposite the first magnetic orientation.

11. The method of claim 10, wherein:

the first magnetic orientation is substantially parallel to and in substantially the same direction as a magnetic orientation in the first magnetic layer; and the second magnetic orientation is substantially parallel to and in substantially the opposite direction as the magnetic orientation in the first magnetic layer.

12. The method of claim 9, wherein the second electrode includes a portion having a winding orientation that is substantially perpendicular to a longitudinal axis of the memory device.

13. The method of claim 9, wherein the flowing the current through the second electrode includes storing data in the memory device.

14. The method of claim 13, wherein the storing the data in the memory device includes storing a first data value when flowing the current through the second electrode along a first direction and storing a second data value when flowing the current through the second electrode along a second direction that is different than the first direction.

15. A method comprising:

providing a memory device having:

a first electrode, a pinned layer disposed over the first electrode, a free layer disposed over the pinned layer, a barrier layer disposed between the pinned layer and the free layer, and a second electrode disposed over the free layer; and flowing a current through the second electrode, wherein the current:

exerts a spin-torque for orienting a magnetic field of the free layer, and produces a magnetic field in the second electrode that assists in orienting the magnetic field of the free layer.

16. The method of claim 15, wherein the flowing the current through the second electrode includes:

generating a first current to flow through the second electrode in a first direction to establish a first magnetic orientation of the magnetic field in the free layer; and generating a second current to flow through the second electrode in a second direction to establish a second magnetic orientation of the magnetic field in the free layer, wherein the second direction is opposite the first direction and the second magnetic orientation is opposite the first magnetic orientation.

17. The method of claim 16, wherein the establishing the first magnetic orientation of the magnetic field in the free layer includes storing a first data value and the establishing the second magnetic orientation of the magnetic field in the free layer includes storing a second data value that is different than the first data value.

18. The method of claim 16, wherein the first magnetic orientation and the second magnetic orientation are substantially parallel to a longitudinal axis of the memory device.

19. The method of claim 15, further comprising reading a data value stored by the memory device.

20. The method of claim 19, wherein the reading the data value stored by the memory device includes measuring a resistance when an electric potential is applied between the first electrode and the second electrode.

* * * * *